US006806796B2

(12) United States Patent
Kadota et al.

(10) Patent No.: US 6,806,796 B2
(45) Date of Patent: Oct. 19, 2004

(54) END-SURFACE REFLECTION TYPE SURFACE ACOUSTIC WAVE FILTER

(75) Inventors: Michio Kadota, Kyoto (JP); Hideya Horiuchi, Nagaokakyo (JP); Junya Ago, Toyama-ken (JP); Takeshi Nakao, Nagaokakyo (JP); Yasuhiro Kuratani, Kyoto (JP)

(73) Assignee: Murata Manfacturing Co., Ltd., Kyoto (JP)

( * ) Notice: Subject to any disclaimer, the term of this patent is extended or adjusted under 35 U.S.C. 154(b) by 0 days.

(21) Appl. No.: 10/725,872

(22) Filed: Dec. 2, 2003

(65) Prior Publication Data

US 2004/0108791 A1 Jun. 10, 2004

Related U.S. Application Data

(63) Continuation of application No. 10/218,017, filed on Aug. 14, 2002.

(30) Foreign Application Priority Data

Aug. 14, 2001 (JP) ........................................ 2001-246249
Jul. 19, 2002 (JP) ........................................ 2002-210355

(51) Int. Cl.[7] ................................................ H03H 9/00
(52) U.S. Cl. ................................... 333/193; 310/313 B
(58) Field of Search ................................ 333/193, 195; 310/313 B, 313 R, 344; 29/25.35; 367/140

(56) References Cited

U.S. PATENT DOCUMENTS 5,260,913 A * 11/1993 Kadota et al. .............. 367/140
6,185,801 B1 * 2/2001 Kadota et al. ............. 29/25.35
6,472,798 B2 * 10/2002 Kishimoto .................. 310/344
6,600,391 B2 * 7/2003 Kadota et al. .............. 333/193

* cited by examiner

*Primary Examiner*—Patrick Wamsley
(74) *Attorney, Agent, or Firm*—Keating & Bennett, LLP

(57) ABSTRACT

An end-surface reflection type surface acoustic wave filter is capable of increasing an attenuation amount outside a pass band while insertion loss characteristics are not seriously deteriorated. The filter is a longitudinally coupled resonator type surface acoustic wave filter using an SH type surface acoustic wave, which has first and second grooves formed in a piezoelectric substrate at the top surface thereof so as to be substantially parallel to each other and spaced from each other by a predetermined distance. In addition, IDTs which are provided between the grooves for defining the longitudinally coupled resonator type surface acoustic wave filter, reflection end-surfaces disposed on side surfaces of the first and the second grooves at the IDT sides, and one of a resin-coating layer and a protective layer made of $SiO_2$, are provided on the top surface of the piezoelectric substrate. The resin-coating layer is arranged to cover at least a region at which the IDTs are located and at least one of the first and the second grooves so as to intrude into one of them, and the protective layer is arranged so as to cover the IDTs.

3 Claims, 14 Drawing Sheets

END-SURFACE REFLECTION TYPE SURFACE ACOUSTIC WAVE FILTER

This application is a Continuation of U.S. patent application Ser. No. 10/218,017 filed Aug. 14, 2002, currently pending.

BACKGROUND OF THE INVENTION

1. Field of the Invention

The present invention relates to surface acoustic wave filters for use, for example, as a band-pass filter, and more particularly, the present invention relates to an end-surface reflection type surface acoustic wave filter which utilizes an SH type surface acoustic wave, such as a BGS wave or a Love wave.

2. Description of the Related Art

A known end-surface reflection type surface acoustic wave device utilizing an SH type surface acoustic wave such as a BGS (Bleustein-Gulyaev-Shimizu) wave or a Love wave is a longitudinally coupled resonator type surface acoustic wave filter. In an end-surface reflection type surface acoustic wave device, a surface acoustic wave is reflected between two end-surfaces opposing each other. Accordingly, reflectors are not necessary and as a result, the surface acoustic wave device such as a surface acoustic wave filter can be miniaturized.

FIG. 14 is a perspective view of a conventional end-surface reflection type and longitudinally coupled resonator type surface acoustic wave filter. A longitudinally coupled resonator type surface acoustic wave filter 101 has a piezoelectric substrate 102. In the piezoelectric substrate 102 on the top surface thereof, a first groove 102a and a second groove 102b are formed so as to be parallel to each other and are spaced from each other by a predetermined distance. Between the grooves 102a and 102b, two interdigital transducers (IDTs) 103 and 104 are provided for constituting the longitudinally coupled resonator type surface acoustic wave filter.

In addition, side surfaces of the first and the second grooves 102a and 102b at the sides at which the IDTs 103 and 104 are located constitute reflection end-surfaces for reflecting an SH-type surface acoustic wave.

In the longitudinally coupled resonator type surface acoustic wave filter 101 described above, since reflectors are not necessary, miniaturization can be achieved. However, it has been required that an attenuation amount outside a pass band be further increased but this has not been possible previously.

SUMMARY OF THE INVENTION

In order to overcome the problems described above, preferred embodiments of the present invention provide an end-surface reflection type surface acoustic wave filter which greatly increases an attenuation amount outside the pass band and significantly improves the degree of selectivity.

In accordance with a first preferred embodiment of the present invention, an end-surface reflection type surface acoustic wave filter includes a piezoelectric substrate having first and second reflection end-surfaces disposed substantially parallel to each other and spaced from each other by a predetermined distance, a top surface, a bottom surface, first and second piezoelectric substrate portions extending from the bottom ends of the first and the second reflection end-surfaces to the outside, and first and second grooves or first and second recess portions open to the outside, the first and the second reflection end-surfaces and the first and the second piezoelectric substrate portions defining the first and the second grooves or the first and the second recess portions, respectively, a plurality of interdigital transducers disposed on the top surface of the piezoelectric substrate between the first and the second grooves or between the first and the second recess portions, and a resin-coating layer which is provided on the top surface of the piezoelectric substrate so as to cover at least the plurality of interdigital transducer and regions at which the first and the second grooves or the first and the second recess portions are disposed and which resin-coating layer includes a flexible resin. In the end-surface reflection type surface acoustic wave filter described above, the resin-coating layer partially intrudes into at least one of the first and the second grooves or at least one of the first and the second recess portions.

In accordance with a second preferred embodiment of the present invention, an end-surface reflection type surface acoustic wave filter includes a piezoelectric substrate having first and second reflection end-surfaces disposed substantially parallel to each other and spaced from each other by a predetermined distance, a top surface, a bottom surface, first and second piezoelectric substrate portions extending from the bottom ends of the first and the second reflection end-surfaces to the outside, and first and second grooves or first and second recess portions open to the outside, the first and the second reflection end-surfaces and the first and the second piezoelectric substrate portions defining the first and the second grooves or the first and the second recess portions, respectively, a plurality of interdigital transducers disposed on the top surface of the piezoelectric substrate between the first and the second grooves or between the first and the second recess portions, and a resin-coating layer which is provided on the top surface of the piezoelectric substrate so as to cover at least the plurality of interdigital transducers and regions at which the first and the second grooves or the first and the second recess portions are disposed and which resin-coating layer includes a flexible resin. In the end-surface reflection type surface acoustic wave filter described above, the resin-coating layer is arranged so as to cover approximately 20% or greater of an area of the top surface of the piezoelectric substrate where the plurality of interdigital transducers are disposed.

In the end-surface reflection type surface acoustic wave filter described above, the flexible resin may preferably have a Shore hardness of about 30 or less. When a resin having a Shore hardness of about 30 or less is used, while deterioration of insertion loss characteristics is suppressed, undesired spurious can be effectively prevented.

In the end-surface reflection type surface acoustic wave filter described above, as the flexible resin described above, a gel resin may be used. Consequently, while deterioration of insertion loss characteristics is suppressed, undesired spurious can be effectively prevented.

In addition, according to another preferred embodiment of the present invention, as the flexible resin described above, a resin having a density of approximately 1.2 g/cm$^3$ or less or, more preferably, approximately 1.0 g/cm$^3$ or less after being cured may be used. Consequently, while deterioration of insertion loss characteristics is suppressed, undesired spurious can be effectively presented.

In the end-surface reflection type surface acoustic wave filter described above, as the flexible resin described above, a resin having a Young's modulus of about 1 MPa or less after being cured may be used. Consequently, while deterioration of insertion loss characteristics is suppressed, undesired spurious can be effectively prevented.

In the end-surface reflection type surface acoustic wave filter described above, as the flexible resin described above, a resin having a linear expansion coefficient of approximately $1.9 \times 10^{-4}$ (1/° C.) or greater or, more preferably, approximately $2.3 \times 10^{-4}$ (1/° C.) or greater after being cured may be used. Consequently, while deterioration of insertion loss characteristics is suppressed, undesired spurious can be effectively prevented.

As the flexible resin described above, a gel resin having a density of about 1.0 g/cm$^3$ or less, a Young's modulus of about 1 MPa or less, and a linear expansion coefficient of about $2.3 \times 10^{-4}$ (1/° C.) or greater after being cured is more preferably used.

As the flexible resin described above, for example, a silicone rubber, an epoxy resin, or a urethane rubber may be used, and more preferably, a silicon rubber is used.

In accordance with a third preferred embodiment of the present invention, an end-surface reflection type surface acoustic wave filter includes a piezoelectric substrate having first and second reflection end-surfaces disposed substantially parallel to each other and spaced from each other by a predetermined distance therebetween, a top surface, a bottom surface, first and second piezoelectric substrate portions extending from the bottom ends of the first and the second reflection end-surfaces to the outside, and first and second grooves or first and second recess portions open to the outside, the first and the second reflection end-surfaces and the first and the second piezoelectric substrate portions defining the first and the second grooves or the first and the second recess portions, respectively, a plurality of interdigital transducers disposed on the top surface of the piezoelectric substrate between the first and the second grooves or between the first and the second recess portions, and a layer which includes SiO$_2$ and is arranged so as to cover the plurality of interdigital transducers.

In addition, in the end-surface reflection surface acoustic wave filter in accordance with the third preferred embodiment of the present invention, when a wavelength of a surface acoustic wave which is to be used is represented by λ, and an electrode thickness of the interdigital transducer is represented by H, H/λ≦0.06 is preferably satisfied, and H/λ≦0.045 is more preferably satisfied. In the case described above, deterioration of insertion loss characteristics can be effectively prevented.

In the end-surface reflection type surface acoustic wave filters in accordance with the first to the third preferred embodiments of the present invention, the grooves or the recess portions each preferably have a depth that is substantially equal to or larger than a wavelength of an SH type surface acoustic wave which is to be used. Propagation of an SH type surface acoustic wave is primarily performed at a depth that is substantially equivalent to or smaller than the wavelength thereof from the surface of the piezoelectric substrate. Accordingly, when each of the grooves or the recess portions has a depth in accordance the range described above, the SH type surface acoustic wave which is to be used is reliably reflected on the end-surfaces, and hence a surface acoustic wave filter having superior properties can be provided.

The structures of the end-surface reflection type surface acoustic wave filters in accordance with the first to the third preferred embodiments of the present invention are not specifically limited, and it may be a ladder type filter including an end-surface reflection resonator, a longitudinally coupled resonator filter, or a transversely coupled resonator filter.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Hereinafter, the present invention will be described in detail with reference to particular preferred embodiments.

Figure 1:
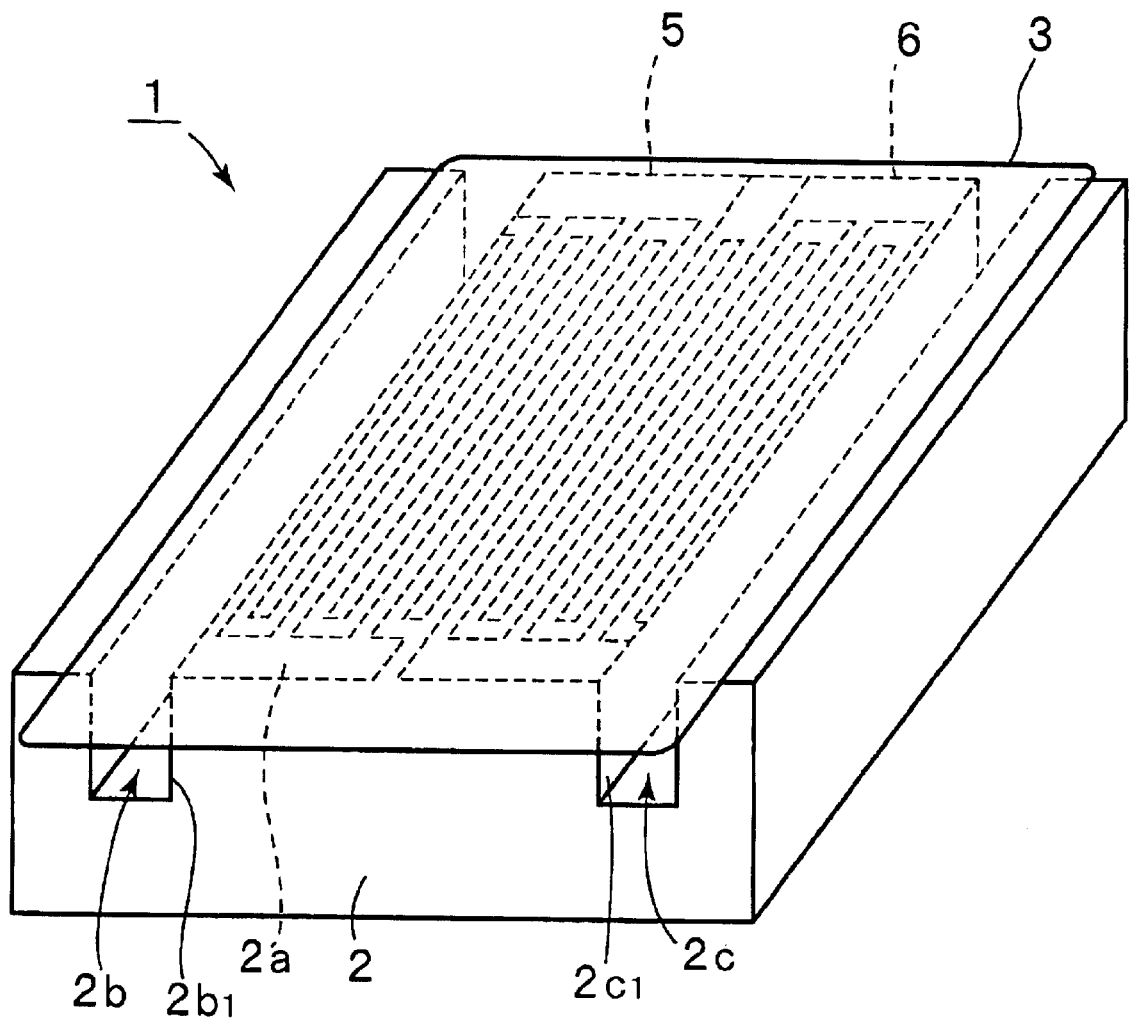
FIG. 1 is a perspective view showing an end-surface reflection type and longitudinally coupled resonator type surface acoustic wave filter according to a preferred embodiment of the present invention.

FIG. 1 is a perspective view of a longitudinally coupled resonator type surface acoustic wave filter 1 according to a preferred embodiment of the present invention. In the longitudinally coupled resonator type surface acoustic wave filter 1, a substantially rectangular piezoelectric substrate 2 is preferably used. The piezoelectric substrate 2 is preferably made of a piezoelectric single crystal, such as $LiTaO_3$ or $LiNbO_3$, or a piezoelectric ceramic such as lead titanate zirconate. However, other suitable materials may be used for the substrate 2. In addition, the piezoelectric substrate 2 may be a laminate formed of piezoelectric thin-films, such as ZnO thin-films, provided on an insulating substrate made of sapphire or other suitable material.

Figure 2:
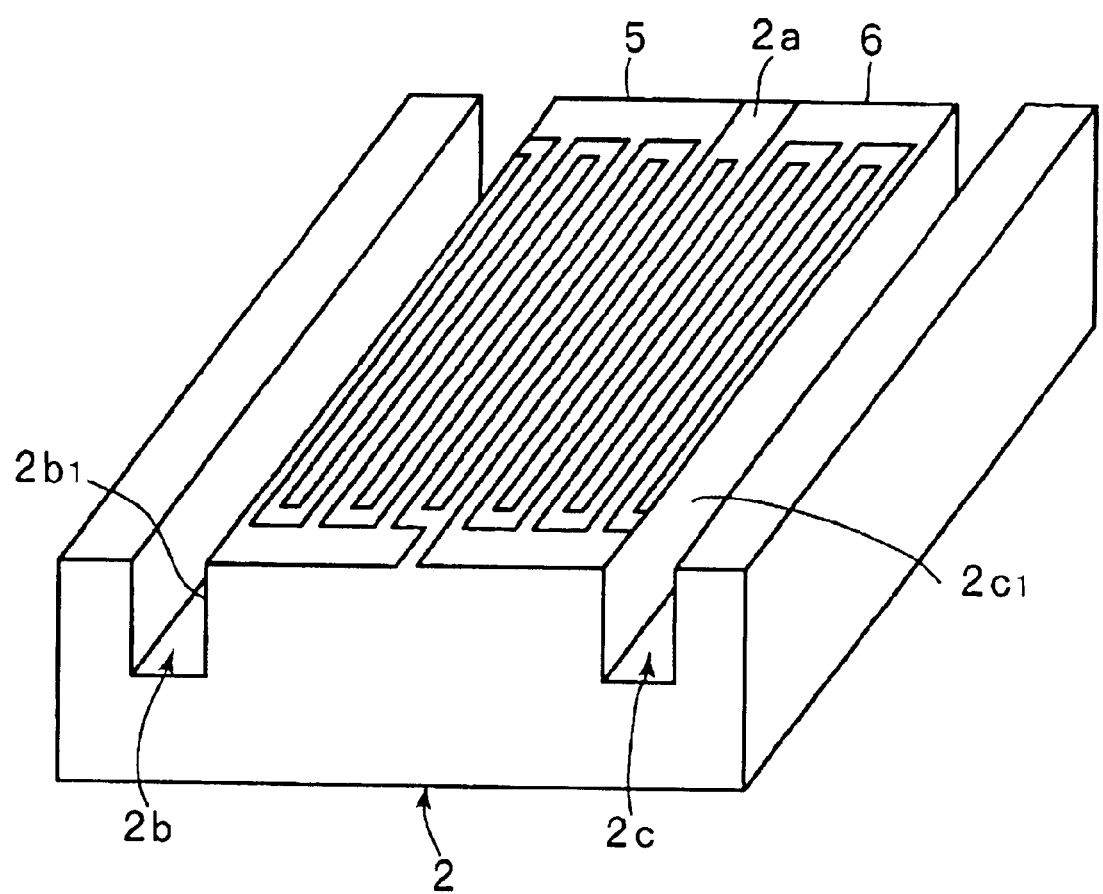
FIG. 2 is a perspective view showing the longitudinally coupled resonator type surface acoustic wave filter shown in FIG. 1 after a resin-coating layer including a flexible resin is removed therefrom.

FIG. 2 is a perspective view showing the longitudinally coupled resonator filter 1 after a flexible resin-coating layer 3 provided on the top surface of the piezoelectric substrate 2 is removed. As shown in FIG. 2, at a top surface 2a of the piezoelectric substrate 2, first and second grooves 2b and 2c are arranged substantially parallel to each other and are spaced from each other by a predetermined distance therebetween. The depth of each of the grooves 2b and 2c is such that they grooves do not to extend to a bottom surface 2d. Side surfaces of the grooves 2b and 2c at the internal sides thereof define first and second reflection end-surfaces $2b_1$ and $2c_1$. The depth of each of the first and the second grooves 2b and 2c is preferably substantially equal to or larger than a wavelength of a surface acoustic wave which is to be used.

Figure 11:
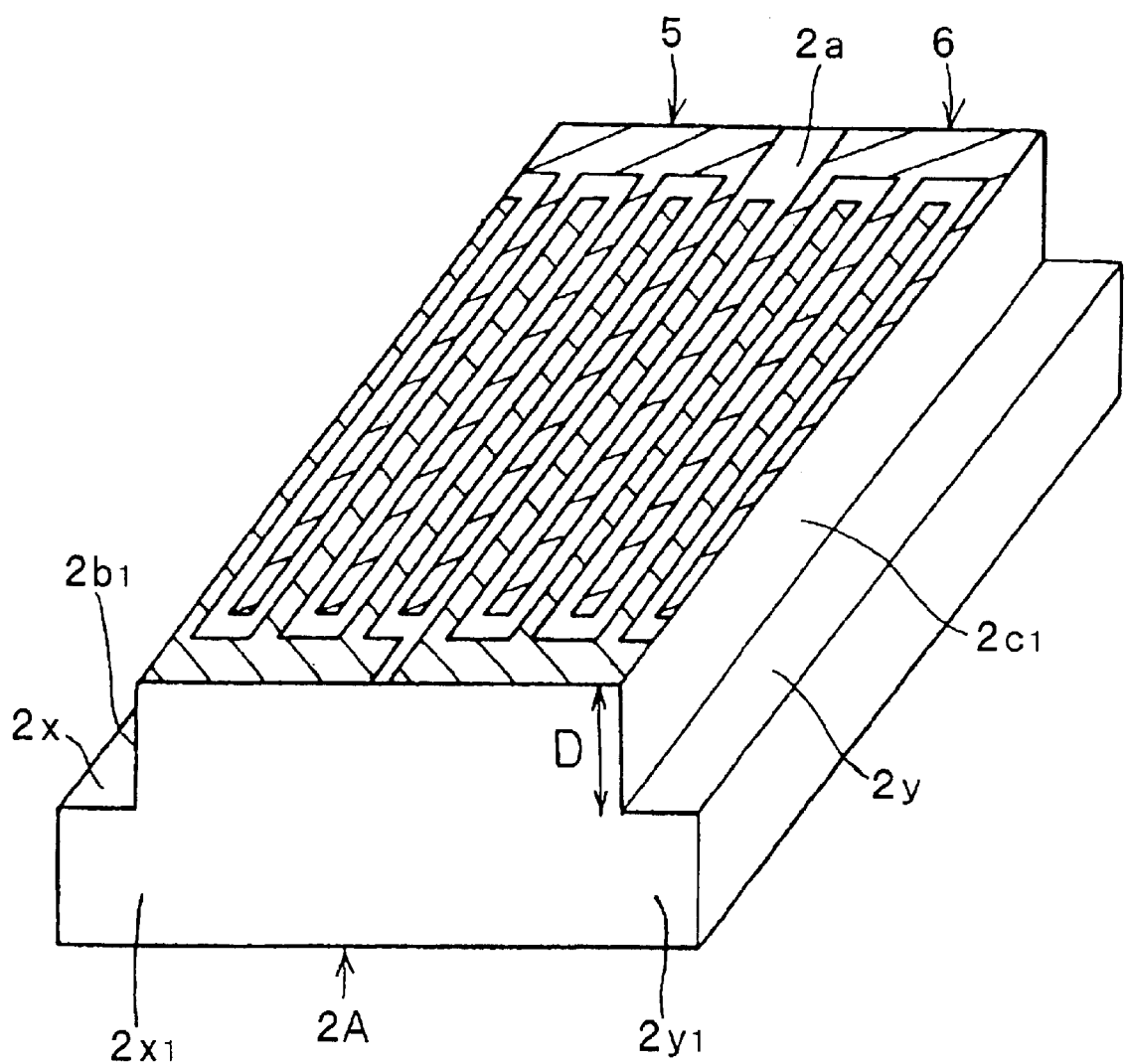
FIG. 11 is a perspective view showing a modified example of a longitudinally coupled resonator type surface acoustic wave filter according to a preferred embodiment of the present invention.

In addition, as shown in FIG. 11, instead of the first and the second grooves 2b and 2c, first and second recess portions 2x and 2y may be formed. That is, in a piezoelectric substrate 2A shown in FIG. 11, first and second reflection end-surfaces $2b_1$ and $2c_1$ are substantially parallel to each other and are spaced from each other by a predetermined distance, and piezoelectric substrate portions $2x_1$ and $2y_1$ extending from the bottom ends of the reflection end-surfaces $2b_1$ and $2c_1$ to the outside are provided, thereby defining the first and the second recess portions 2x and 2y which are open to the outside. In the present invention, as described above, instead of the first and the second grooves, the piezoelectric substrate 2A having the first and the second recess portions open to the outside may be used.

Between the first and the second grooves 2b and 2c, longitudinally coupled resonator type filter portions are defined. The longitudinally coupled resonator type filter portion has a pair of IDTs 5 and 6 disposed in the direction of surface acoustic wave propagation.

The longitudinally coupled resonator type surface acoustic wave filter of the present invention is not limited to the one-stage structure described above, and a longitudinally coupled resonator type surface acoustic wave filter having at least a two-stage structure may be used. In accordance with the structure of a surface acoustic wave filter which is to be provided, a plurality of IDTs is disposed on the top surface of the piezoelectric substrate 2.

One of the unique features of the longitudinally coupled resonator type surface acoustic wave filter 1 of this preferred embodiment is that the flexible resin-coating layer 3 shown in FIG. 1 is arranged so as to cover the top surface 2a of the piezoelectric substrate 2 described above. The flexible resin-coating layer 3 is arranged so as to cover the IDTs 5 and 6 and the first and the second grooves 2b and 2c. In addition, in this preferred embodiment, portions of the top surface of the piezoelectric substrate 2 at the external sides of the first and the second grooves 2b and 2c are also covered with the flexible resin-coating layer 3. However, it is not necessarily required that the portions of the top surface of the piezoelectric substrate 2 described above be covered with the flexible resin-coating layer 3.

The flexible resin-coating layer 3 is preferably made of a resin having flexibility so as not to suppress propagation of a surface acoustic wave which is excited when the longitudinally coupled resonator type surface acoustic wave filter 1 operates. As the resin described above, various resins may be used, and in particular, a gel resin is preferably used. In addition, as the flexible resin described above, a silicone rubber, an epoxy resin, or a urethane rubber is preferably used, and in particular, a silicone rubber is more preferably used. Preferable characteristics of a flexible resin may be described later in details with reference to various preferred embodiments.

Figure 3:
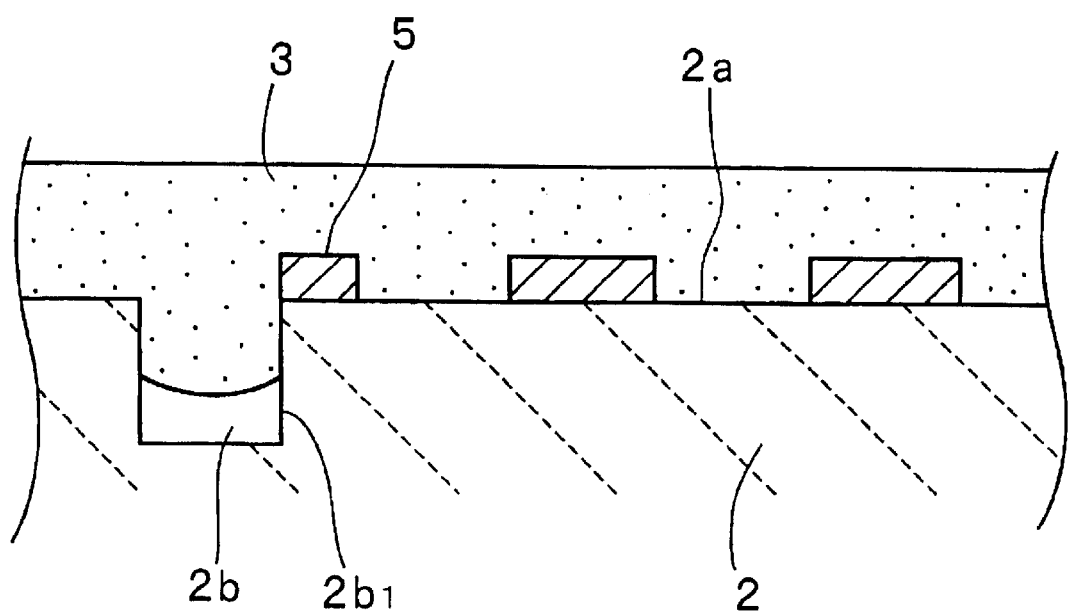
FIG. 3 is a partial, cutaway cross-sectional view for illustrating a major portion of the longitudinally coupled resonator type surface acoustic wave filter according to the preferred embodiment shown in FIG. 1.

In addition, as shown in FIG. 3, the resin-coating layer 3 is arranged so as to intrude into the first groove 2b.

In the longitudinally coupled resonator type surface acoustic wave filter 1, since the flexible resin-coating layer 3 is arranged so as to cover the regions at which the IDTs 5 and 6 are located and the grooves 2b and 2c and so as to intrude into the groove 2b, an attenuation amount outside the pass band can be increased. Hereinafter, this preferred embodiment will be described with reference to a specific example.

As the longitudinally coupled resonator type surface acoustic wave filter according to the preferred embodiment described above, a piezoelectric substrate, made of $LiTaO_3$, having outside dimensions of approximately 0.9 mm, 1.7 mm, and 0.38 mm of thickness was prepared, and on the top surface thereof, the IDTs 5 and 6 were formed. The total number of pairs of electrode fingers of each of the IDTs 5 and 6 was 30 and the wavelength therefor was about 21.8 $\mu$m. In addition, after the IDTs were formed, the first and the second grooves 2b and 2c each having a width of about 0.17 mm and a depth of about 0.1 mm were formed. The longitudinally coupled resonator type surface acoustic wave filter thus formed was used as a conventional example, and as a longitudinally coupled resonator type surface acoustic wave filter according to the present preferred embodiment, the filter described above was provided with a flexible resin-coating layer 3 made of a gel silicone resin on the top surface thereof.

Figure 4:
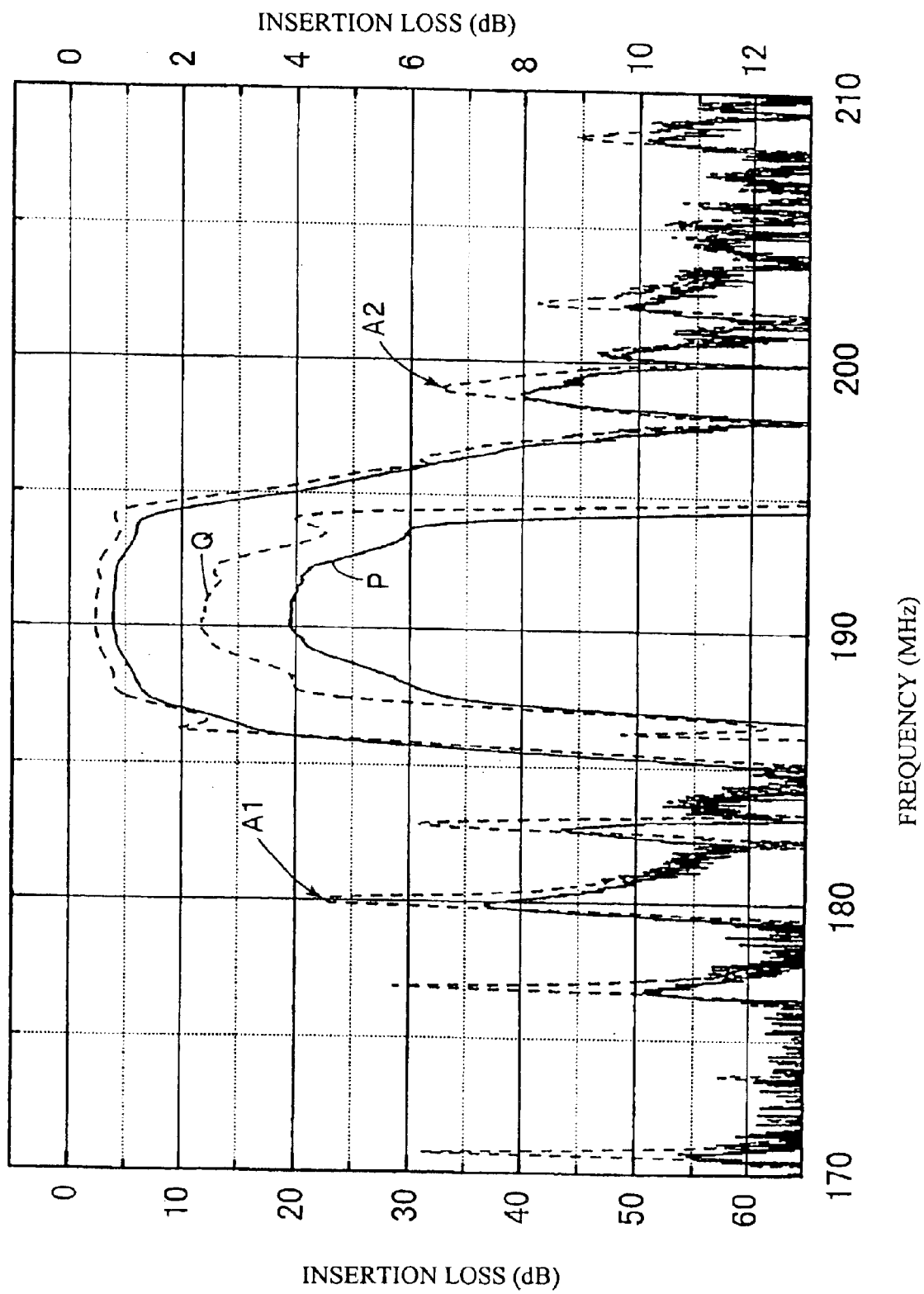
FIG. 4 is a graph showing attenuation amount versus frequency characteristics of longitudinally coupled resonator type surface acoustic wave filters according to a preferred embodiment of the present invention and a conventional example.

Attenuation amount versus frequency characteristics of the longitudinally coupled resonator type surface acoustic wave filters according to the conventional example and the present preferred embodiment were measured. The results are shown in FIG. 4. The solid line in FIG. 4 shows the characteristics of the present preferred embodiment, and the dotted line shows the characteristics of the conventional example. In addition, the solid line P and the dotted line Q shown in the central portion in FIG. 4 show the characteristics of the present preferred embodiment and the conventional example, respectively, which characteristics are represented in accordance with an expanded scale in the vertical axis at the right side.

As shown in FIG. 4, in the longitudinally coupled resonator type surface acoustic wave filter of the preferred embodiment, which is provided with the flexible resin-coating layer 3, a loss is slightly increased in the pass band. However, it is understood that the attenuation amount outside the pass band can be significantly improved. The reason for this has been considered that since the flexible resin-coating layer 3 is provided so as to intrude into the first groove 2b, reflection of an unnecessary wave between the reflection end-surfaces is prevented.

According to the results described above, the inventors of the present invention variously changed the coating area of the flexible resin-coating layer 3 on the top surface of the piezoelectric substrate 2 and measured the suppression degree of spurious indicated by the arrows A1 and A2 shown in FIG. 4. The results are shown in FIG. 5.

Figure 5:
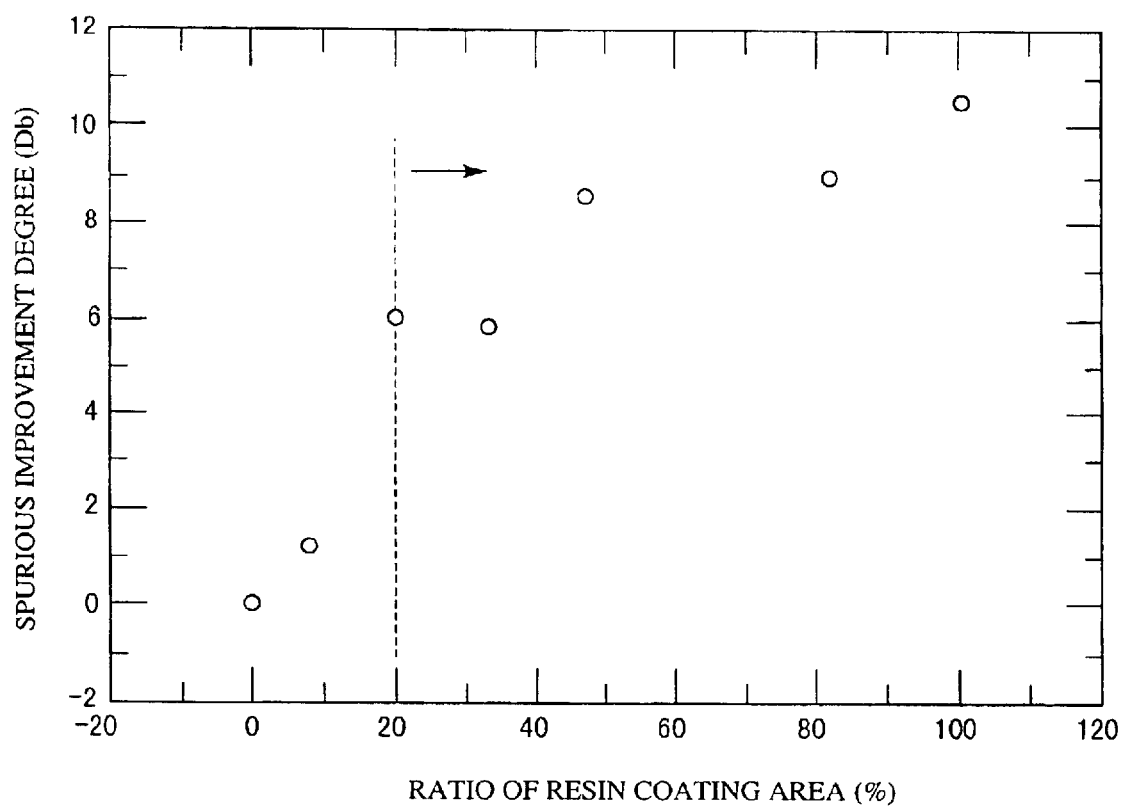
FIG. 5 is a graph showing the relationship between spurious suppression and a ratio of resin coating area.

In this preferred embodiment, a ratio (%) of the resin coating area in the horizontal axis shown in FIG. 5 is a ratio of the coating area of the resin-coating layer 3 to the area of the top surface of the piezoelectric substrate 2 where the IDTs 5 and 6 are disposed, in other words, an area of the top surface of the piezoelectric substrate 2 sandwiched by reflection end-surfaces $2b_1$, and $2c_1$.

As shown in FIG. 5, it can be understood that, with an increase in resin coating area of the insulating resin-coating layer 3, the spurious responses indicated by the arrows A1 and A2 are suppressed, and as a result, it is understood that the attenuation amount outside the pass band is greatly increased.

In addition, the relationship among the intrusion amount of the flexible resin-coating layer 3 into the first and the second grooves, the insertion loss within the pass band, and the above-described spurious level outside the pass band was measured. The results are shown in FIGS. 6 and 7.

Figure 6:
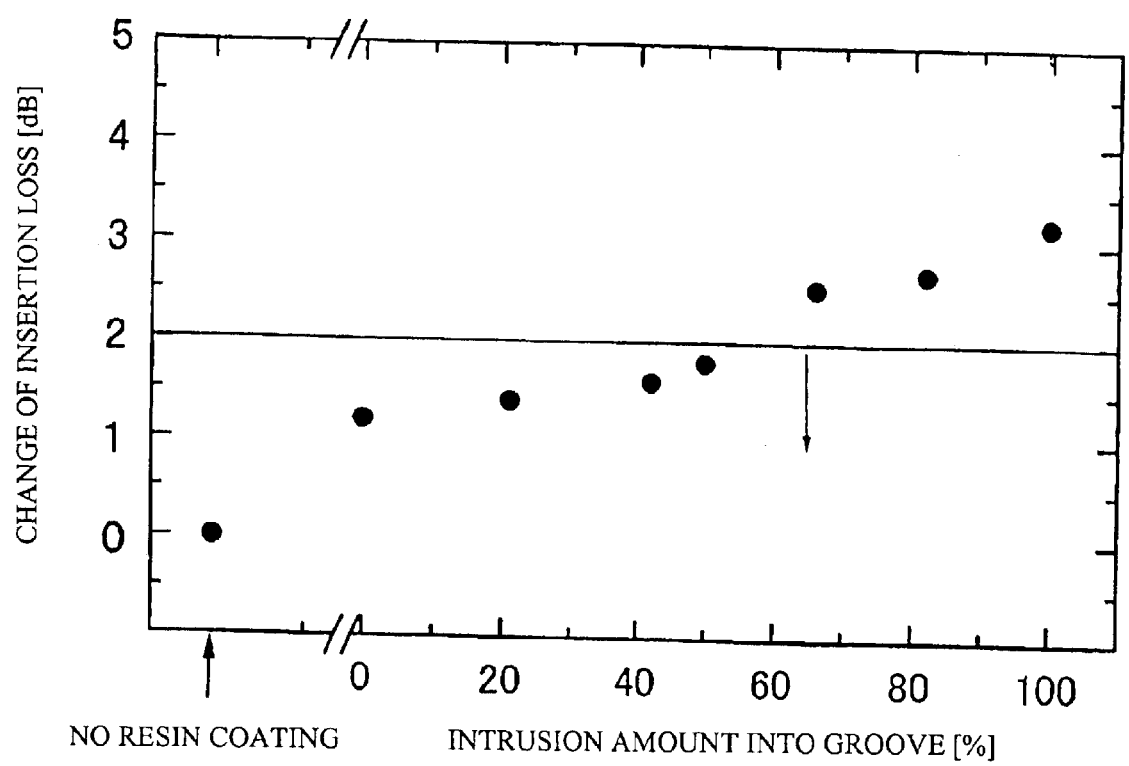
FIG. 6 is a graph showing the relationship between insertion loss and an intrusion amount of a resin-coating layer into a first groove.
Figure 7:
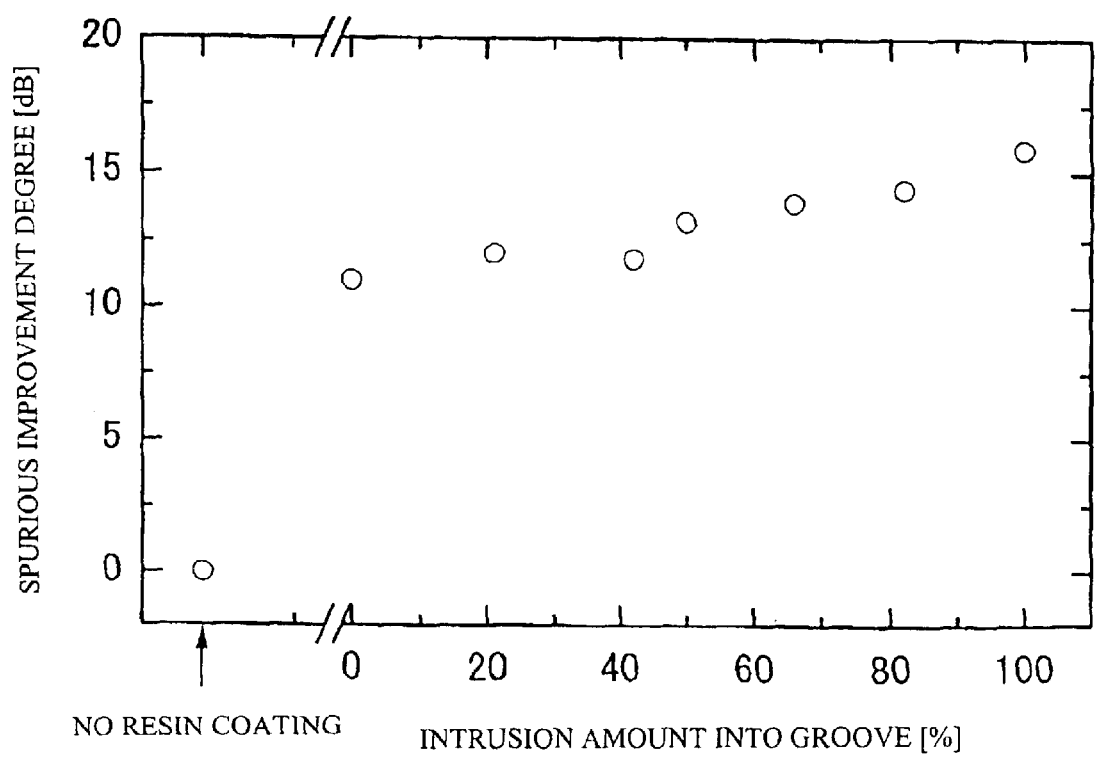
FIG. 7 is a graph showing the relationship between an intrusion amount of a resin-coating layer into the first groove and spurious suppression outside the pass band.

An intrusion amount of zero shown in FIGS. 6 and 7 means that the flexible resin-coating layer 3 is provided only in the region at which the IDTs 5 and 6 are located, and an intrusion amount in the range of about 0% to about 100% means a ratio of a cross-sectional area of the flexible resin-coating layer 3 which intrudes into the groove $2b$ to a cross-sectional area of the groove $2b$.

As shown in FIG. 6, as intrusion amount of the flexible resin-coating layer 3 into the groove increases, the insertion loss deteriorates. However, when the intrusion amount of the flexible resin-coating layer 3 into the groove $2b$ is about 50% or less, it is understood that deterioration of insertion loss characteristics can be suppressed to about 2 dB or less. Accordingly, when the intrusion amount of the flexible resin-coating layer 3 into the groove $2b$, which is one of the grooves, is about 50% or less, the insertion loss characteristic is not so much deteriorated. As shown in FIG. 7, it is understood that the spurious can be suppressed in the proximity of the pass band, and hence the attenuation amount outside the pass band can be increased.

Accordingly, the flexible resin-coating layer 3 is preferably arranged so that the intrusion amount thereof into one of the first and the second grooves $2b$ and $2c$ is at a ratio of about 50% or less.

Figure 8:
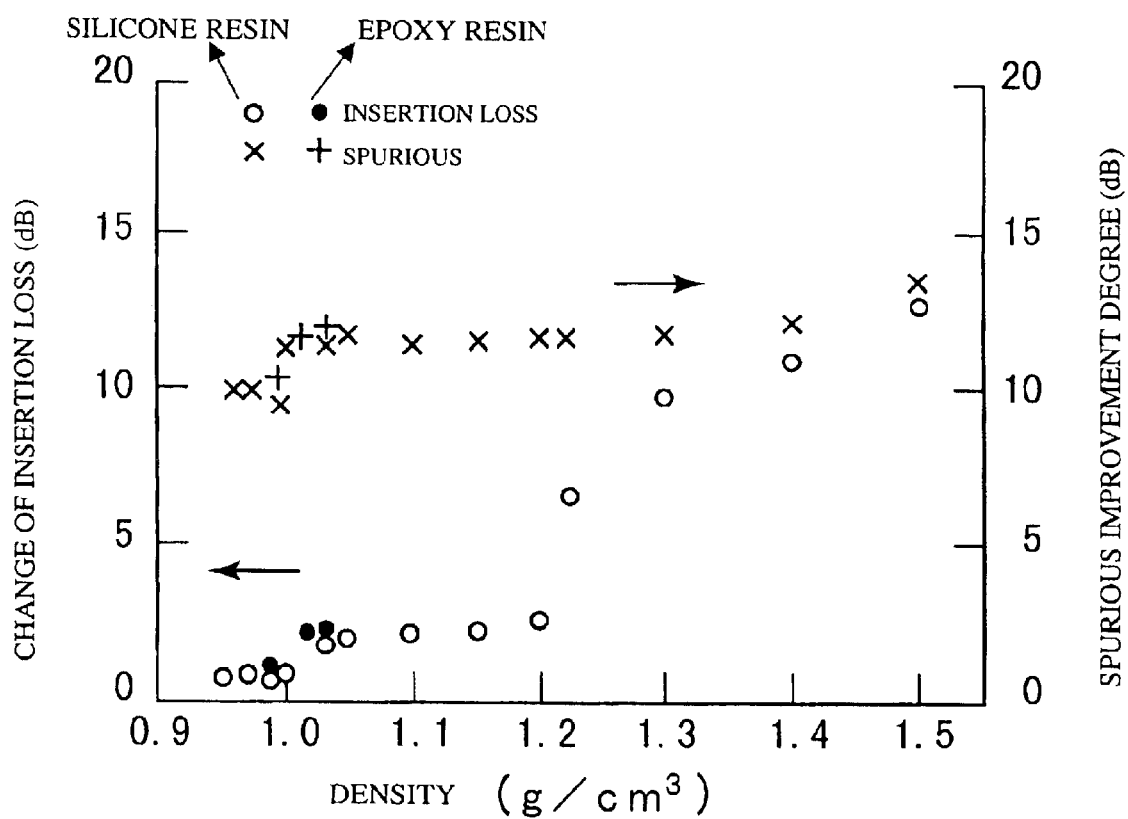
FIG. 8 is a graph showing the relationship among density of a cured resin-coating layer, insertion loss, and spurious suppression.

Next, in the preferred embodiment described above, the inventors of the present invention variously changed materials used for forming the flexible resin-coating layer and measured the relationship among the density thereof, the insertion loss, and the suppression of spurious, i.e. spurious improvement degree indicated by the arrows A1 and A2 in FIG. 4. The results are shown in FIG. 8. The horizontal axis of FIG. 8 indicates density of the flexible resin-coating layer, and in this case, the resin coating area of the flexible resin-coating layer was 100%. In addition, in FIG. 8, mark ● indicates the result of the insertion loss in the case in which the resin-coating layer was made of an epoxy resin, mark + indicates the result of the spurious suppression in the above case in which the epoxy resin was used, mark ○ indicates the result of the insertion loss obtained when a silicone resin was used, and mark x indicates the result of the spurious suppression in the above case in which the silicone resin was used.

Figure 9:
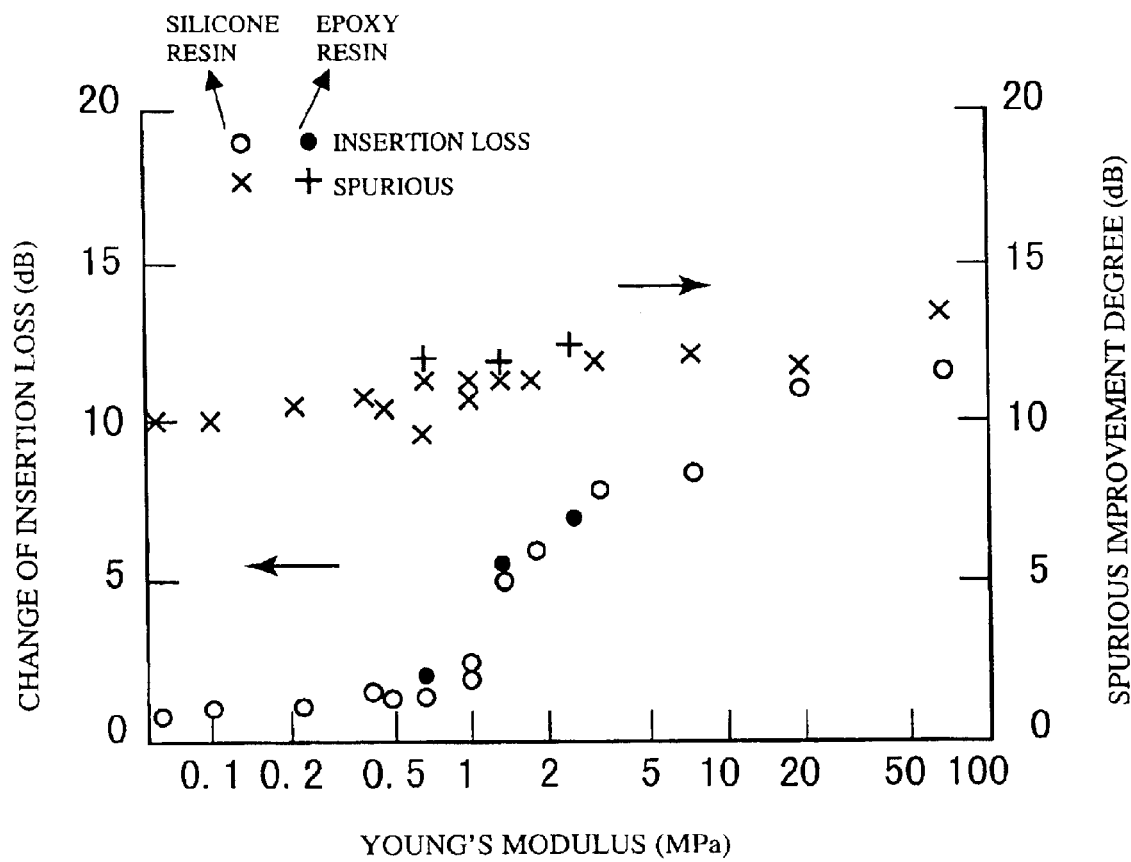
FIG. 9 is a graph showing the relationship among Young's modulus of a cured resin-coating layer, insertion loss, and spurious suppression.

In addition, the relationship among Young's modulus of a material forming the flexible resin-coating layer, the insertion loss, and the spurious suppression is shown in FIG. 9. Marks ●, +, ○, and x in FIG. 9 are the same as those in the case described with reference to FIG. 8.

Figure 10:
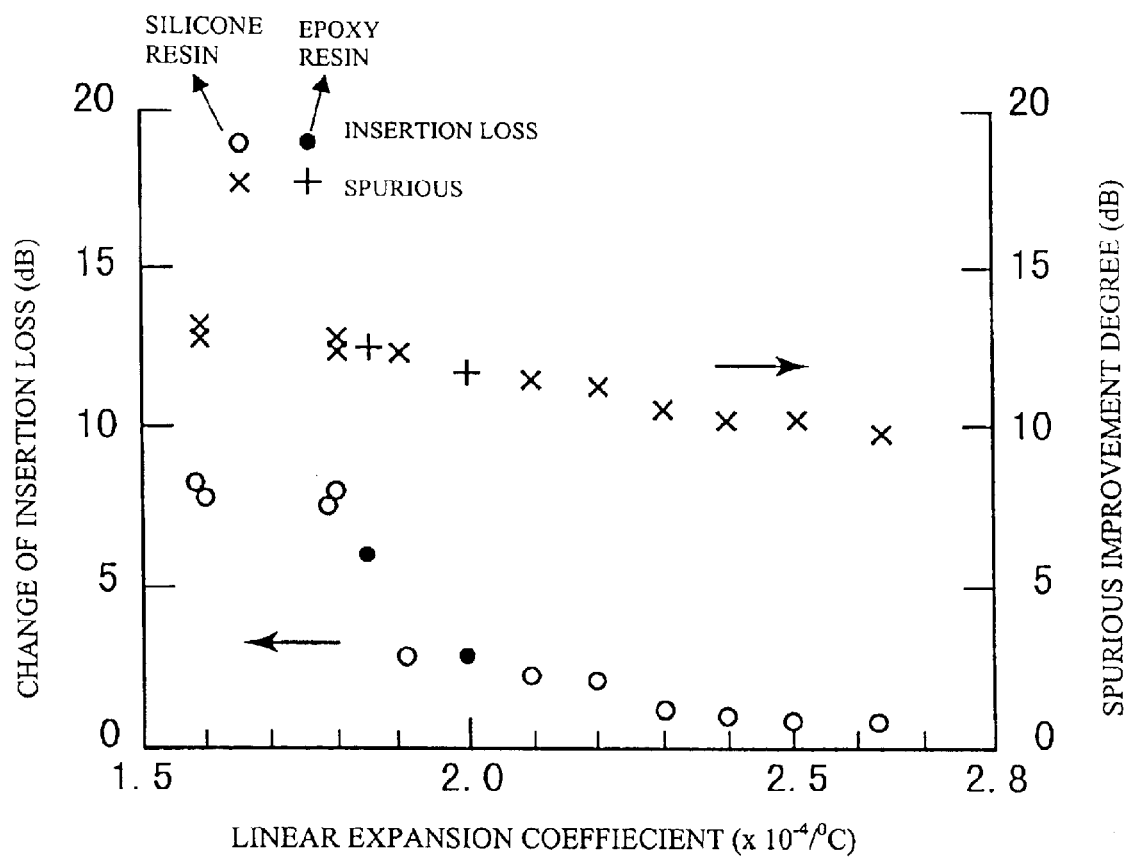
FIG. 10 is a graph showing the relationship among a linear expansion coefficient of a cured resin-coating layer, insertion loss, and spurious suppression.

Furthermore, the relationship among a linear expansion coefficient ($\times 10^{-4}/°$ C.) of the flexible resin-coating layer, the insertion loss, and the spurious suppression is shown in FIG. 10. Marks ●, +, ○, and x in FIG. 10 are the same as those in the case described with reference to FIG. 8.

As shown in FIG. 8, when the density of the cured flexible resin-coating layer is preferably about 1.2 g/cm$^3$ or less and is more preferably about 1.0 g/cm$^3$ or less, it is understood that while the deterioration of insertion loss characteristics is suppressed, spurious can be effectively prevented.

As in the case described above, as shown in FIG. 9, when the Young's modulus of the cured flexible resin-coating layer is about 1 MPa or less, it is understood that while the deterioration of insertion loss characteristics is suppressed, the spurious can be effectively prevented as in the case described above.

In addition, as shown in FIG. 10, when the linear expansion coefficient of the cured flexible resin-coating layer is preferably about $1.9 \times 10^{-4}$ (1/° C.) or greater and is more preferably about $2.3 \times 10^{-4}$ (1/° C.) or greater, it is understood that while the deterioration of insertion loss characteristics is suppressed, the spurious can be effectively prevented. Accordingly, a preferable resin forming the flexible resin-coating layer described above is a gel resin, and after being cured, the resin described above preferably has a density of about 1.0 g/cm or less, a Young's modulus of about 1 MPa or less, and a linear expansion coefficient of about $2.3 \times 10^{-4}$ (1/° C.) or greater.

Figure 12A:
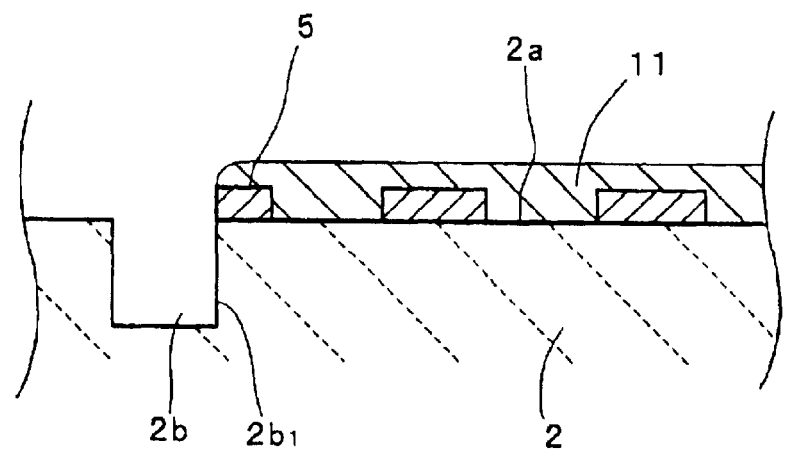
FIG. 12A is a partial, cutaway cross-sectional view of another modified example of a longitudinally coupled resonator type surface acoustic wave filter according to a preferred embodiment of the present invention.

In accordance with another preferred embodiment of the present invention, a protective layer 11 made of $SiO_2$ is provided on the top surface $2a$ of the piezoelectric substrate 2 so as to cover the IDT 5. In FIG. 12A, a portion of the top surface $2a$ at which the IDT 6 is provided is not shown. However, the protective layer 11 is also arranged so as to cover the IDT 6.

Figure 12B:
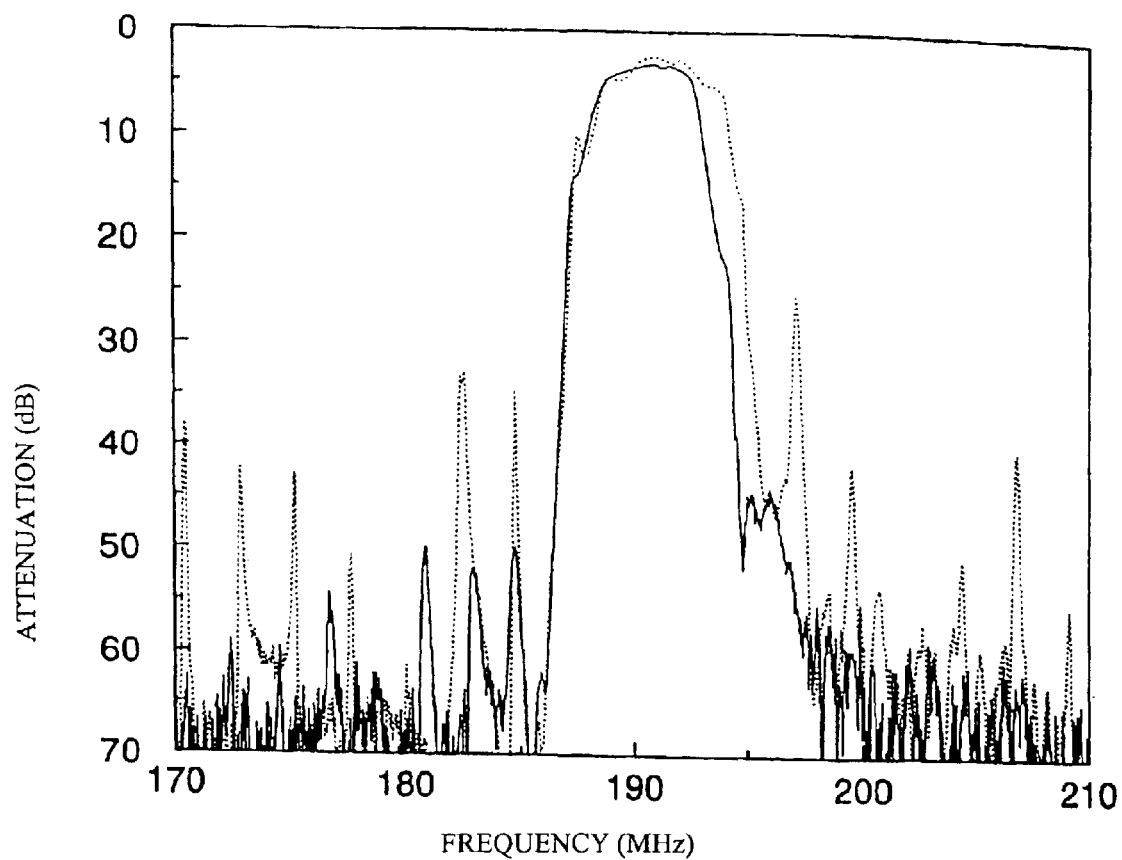
FIG. 12B is a graph showing attenuation amount versus frequency characteristics of said another modified example of a preferred embodiment of the present invention and that of a surface acoustic wave filter which is prepared for comparison therewith.

In FIG. 12B, attenuation amount versus frequency characteristics of a longitudinally coupled resonator type surface acoustic wave filter provided with the protective layer 11 described above are shown by the solid line. For comparison, attenuation amount versus frequency characteristics of a longitudinally coupled resonator type surface acoustic wave filter, having the same structure as that described above except that the protective layer is not provided, are shown by the dotted line. As the piezoelectric substrate, 36° $LiTaO_3$ is used, and as a metal forming the IDTs 5 and 6, aluminum (Al) is used. In addition, when a wavelength of a surface acoustic wave is represented by λ, a thickness h of the $SiO_2$ film is set such that h/λ=0.30 is satisfied.

As shown in FIG. 12B, by providing the protective layer 11, it is understood that while the insertion loss characteristics are not significantly deteriorated, the spurious outside the pass band can be effectively decreased. In addition, by providing the protective layer described above, as compared to a surface acoustic wave filter having no protective layer, temperature coefficient of frequency can also be decreased.

Figure 13:
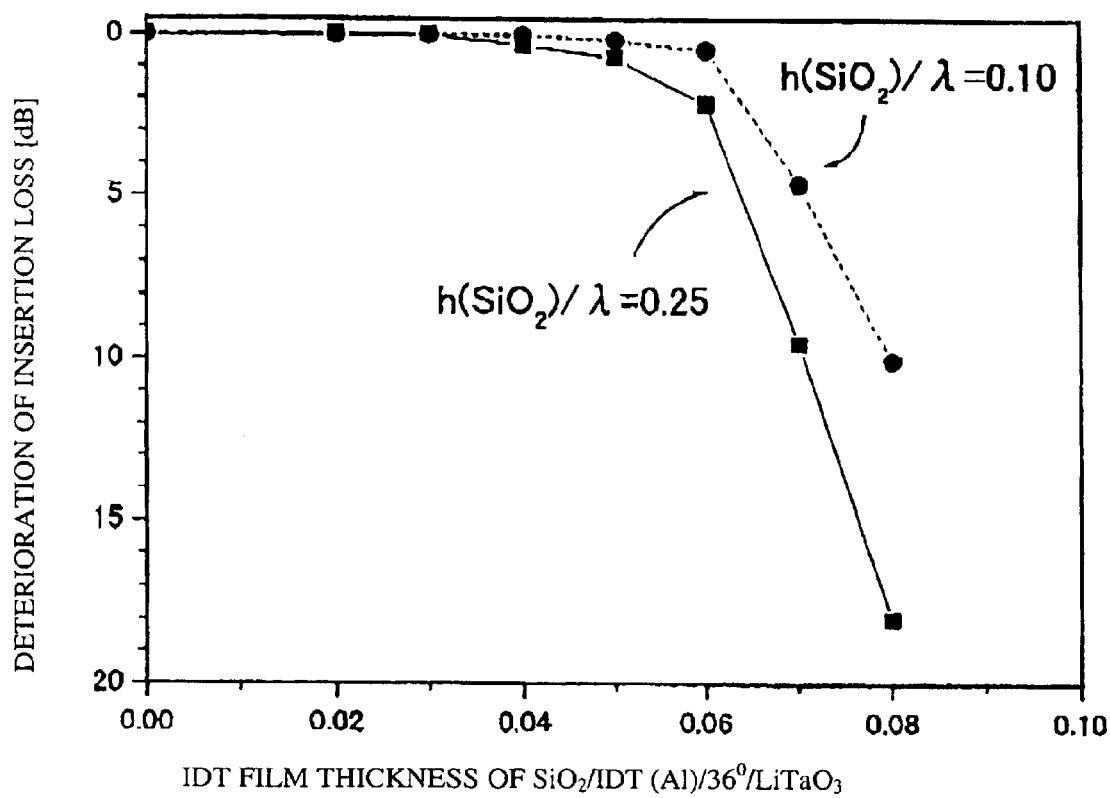
FIG. 13 is a graph showing the relationship between insertion loss and IDT thickness of the surface acoustic wave filter shown in FIG. 12A.
Figure 14:
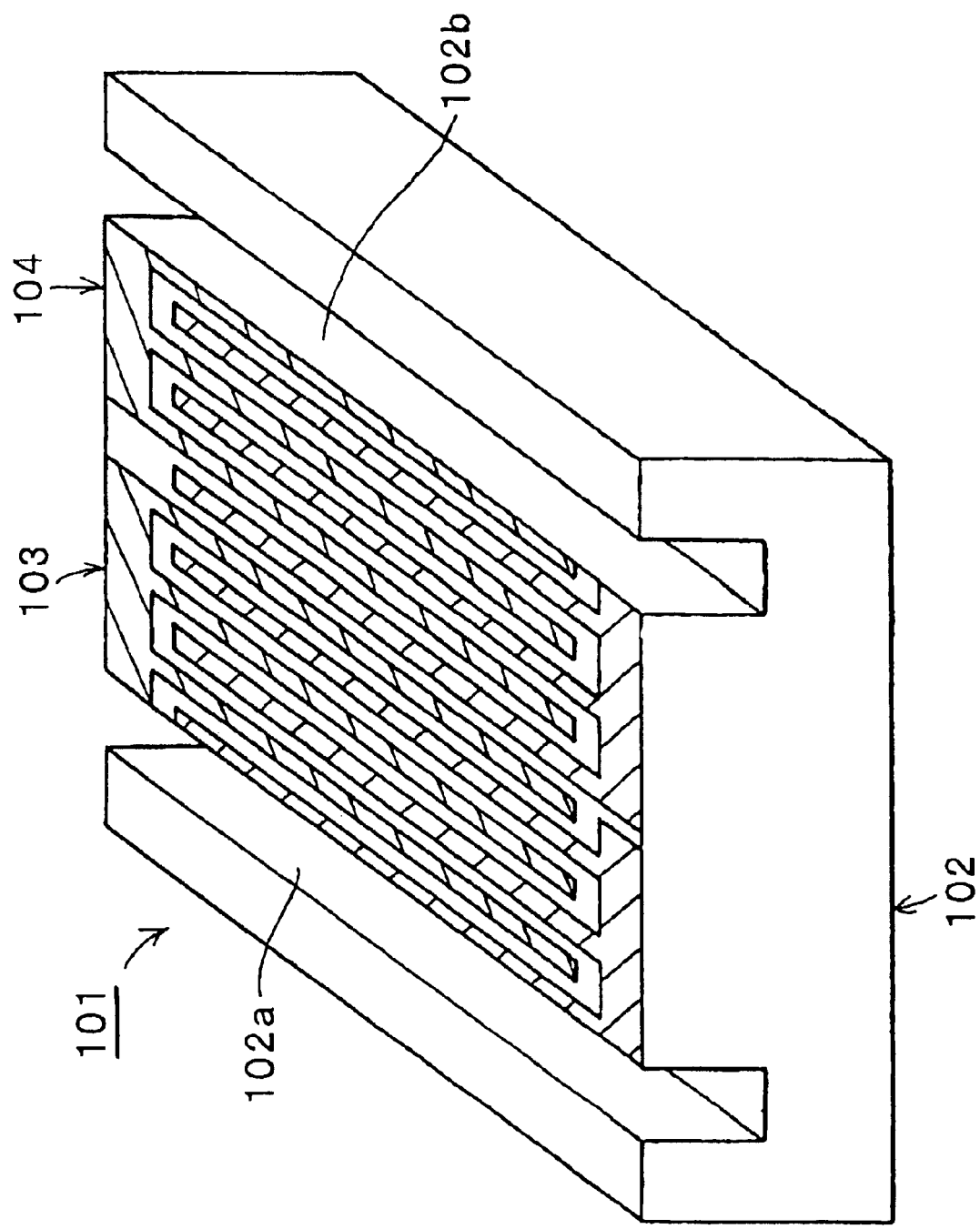
FIG. 14 is a perspective view showing a conventional longitudinally coupled resonator type surface acoustic wave filter.

In FIG. 13, deterioration of the insertion loss characteristics of the surface acoustic wave filter is shown when the IDT thickness is changed. As shown in FIG. 13, when a wavelength of a surface acoustic wave filter which is to be used is represented by λ, and a thickness H of the IDT electrode is set such that H/λ is preferably about 0.06 or less and is more preferably about 0.045 or less, the deterioration of the insertion loss characteristics can be prevented.

In the case shown in FIG. 13, Al is preferably used for the IDT; however, when copper (Cu), gold (Au), or other suitable material is used for the IDT, the inventors of the present invention confirmed that the same advantages as those described above could be obtained.

In the end-surface reflection type surface acoustic wave filter in accordance with the first preferred embodiment of the present invention, although the side surfaces of the first and the second grooves or the first and the second recess portions, which are disposed in the piezoelectric substrate at the IDT side, are used as reflection end-surfaces, the flexible resin-coating layer is arranged so as to cover at least the region at which the IDTs are located, and at least one of the first and the second grooves or at least one of the first and the second recess portions, and the flexible resin-coating layer intrudes into one of the grooves or one of the recess portions. Accordingly, while the insertion loss characteristics are not seriously deteriorated, the attenuation amount outside the pass band can be increased. As a result, a compact surface acoustic wave filter which has superior degree of selectivity and which does not require reflectors can be provided.

In the end-surface reflection type surface acoustic wave filter in accordance with the second preferred embodiment of the present invention, since the flexible resin-coating layer is arranged so as to cover about 20% or greater of an area of the top surface of the piezoelectric substrate where the plurality of interdigital transducers are located, as in the case of the first preferred embodiment of the present invention, while the insertion loss characteristics are not so seriously deteriorated, the attenuation amount outside the pass band can be increased. Consequently, a compact surface acoustic wave filter which has superior degree of selectivity and which does not require reflectors can be provided.

In the end-surface reflection type surface acoustic wave filter in accordance with the third preferred embodiment of the present invention, since the layer made of $SiO_2$ is disposed on the top surface of the piezoelectric substrate so as to cover the IDTs, as in the cases of the first and the second preferred embodiments of the present invention, while the insertion loss characteristics are not so seriously deteriorated, the attenuation amount outside the pass band can be increased. Consequently, a compact surface acoustic wave filter which has superior degree of selectivity and which does not require reflectors can be provided.

When the depth of the first and the second grooves or the first and the second recess portions is substantially equivalent to or larger than a wavelength of an SH type surface acoustic wave which is to be used, the SH type surface acoustic wave to be used is reliably reflected on the side surfaces of the first and the second grooves or the first and the second recess portions at the IDT side, and hence an end-surface reflection type surface acoustic wave filter having superior properties can be obtained.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An end-surface reflection type surface acoustic wave filter comprising:

a piezoelectric substrate including first and second reflection end-surfaces disposed substantially parallel to each other and spaced from each other by a predetermined distance, a top surface, a bottom surface, first and second piezoelectric substrate portions which extend from bottom ends of the first and the second reflection end-surfaces to outside of the filter, and first and second grooves or first and second recess portions open to the outside of the filter, the first and the second reflection end-surfaces and the first and the second piezoelectric substrate portions defining the first and the second grooves or the first and the second recess portions, respectively;

a plurality of interdigital transducers disposed on the top surface of the piezoelectric substrate between the first and the second grooves or between the first and the second recess portions; and a layer which includes SiO2 and is arranged so as to cover said plurality of interdigital transducers.

2. An end-surface reflection type surface acoustic wave filter according to claim 1, wherein, when a wavelength of a surface acoustic wave which is to be used is represented by λ, and an electrode thickness of the interdigital transducer is represented by H, H/λ≦0.06 is satisfied.

3. An end-surface reflection type surface acoustic wave filter according to claim wherein, when a wavelength of a surface acoustic wave which is to be used is represented by λ, and an electrode thickness of the interdigital transducer is represented by H H/λ≦0.045 is satisfied.

* * * * *